US007738849B2

(12) United States Patent
Frank et al.

(10) Patent No.: US 7,738,849 B2
(45) Date of Patent: Jun. 15, 2010

(54) OUTPUT IMPEDANCE INSENSITIVE POWER AMPLIFIER ARCHITECTURE

(75) Inventors: Michael Louis Frank, Menlo Park, CA (US); John Stephen Kofol, Sunnyvale, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 1047 days.

(21) Appl. No.: 11/251,270

(22) Filed: Oct. 14, 2005

(65) Prior Publication Data

US 2007/0087706 A1    Apr. 19, 2007

(51) Int. Cl.
*H04B 1/06* (2006.01)
*H04B 7/00* (2006.01)

(52) U.S. Cl. .............. 455/245.1; 455/127.2; 455/232.1; 455/234.1

(58) Field of Classification Search .............. 455/127.1, 455/127.2, 78, 550.1, 115.1, 126, 245.1, 455/232.1, 114.3, 234.1; 330/254, 279, 85, 330/96
See application file for complete search history.

(56) References Cited

U.S. PATENT DOCUMENTS

| | | | | | |
|---|---|---|---|---|---|
| 5,278,994 | A | * | 1/1994 | Black et al. ................. | 455/126 |
| 5,432,473 | A | * | 7/1995 | Mattila et al. ............... | 330/133 |
| 5,977,831 | A | * | 11/1999 | Davis et al. ................. | 330/279 |
| 5,987,333 | A | * | 11/1999 | Sole ........................... | 455/522 |
| 6,060,950 | A | * | 5/2000 | Groe ........................... | 330/279 |
| 6,424,216 | B2 | * | 7/2002 | Mu et al. ................... | 330/207 P |
| 6,580,318 | B2 | * | 6/2003 | Taylor ........................ | 330/129 |
| 6,600,369 | B2 | * | 7/2003 | Mitzlaff ...................... | 330/149 |
| 6,615,052 | B1 | * | 9/2003 | Parmenter ................... | 455/522 |
| 6,734,729 | B1 | * | 5/2004 | Andrys et al. .............. | 330/129 |
| 6,744,316 | B2 | * | 6/2004 | Louis et al. ................. | 330/151 |
| 6,798,287 | B2 | * | 9/2004 | Wu et al. .................... | 330/129 |
| 6,803,818 | B2 | * | 10/2004 | van Amerom ............... | 330/144 |
| 6,891,438 | B2 | * | 5/2005 | Arai et al. ................... | 330/296 |
| 6,972,626 | B2 | * | 12/2005 | Takahashi et al. ........... | 330/279 |
| 6,985,033 | B1 | * | 1/2006 | Shirali et al. ................ | 330/149 |
| 7,062,237 | B2 | * | 6/2006 | Brandt ..................... | 455/127.1 |
| 7,076,218 | B2 | * | 7/2006 | Greverie et al. .......... | 455/127.1 |
| 7,096,034 | B2 | * | 8/2006 | Zhang et al. ................ | 455/522 |
| 7,116,173 | B2 | * | 10/2006 | Tsutsui et al. .............. | 330/285 |
| 7,145,396 | B2 | * | 12/2006 | Dupuis ....................... | 330/298 |
| 7,250,818 | B2 | * | 7/2007 | Ayun et al. ................. | 330/140 |
| 2002/0146993 | A1 | * | 10/2002 | Persico et al. .............. | 455/126 |

* cited by examiner

*Primary Examiner*—Sonny Trinh

(57) ABSTRACT

An apparatus and method for adapting a power amplifier to a variable load includes comparing the actual output power to the expected output power, modifying a drive signal to the power amplifier, measuring the value of at least one electrical parameter, determining the difference between the measured value and a predetermined value, and periodically adjusting the drive signal according to the difference. The parameters modified include, but are not limited to, the power delivered to the input of the power amplifier, the DC power supply voltage to any stage of the power amplifier, and the current setting bias values.

7 Claims, 2 Drawing Sheets

OUTPUT IMPEDANCE INSENSITIVE POWER AMPLIFIER ARCHITECTURE

BACKGROUND

When a handset is brought into proximity to a reflector, e.g. a tabletop or hand, the near field of the antenna is disrupted. This disruption changes the impedance of the antenna and thus changes the output load impedance of the power amplifier (PA). Since the power amplifier efficiency, linearity and harmonic performance are functions of load impedance, when the antenna is mismatched, the transmitter loses efficiency and distorts the output signal. The power efficiency loss results in less talk time but can be mitigated with a larger battery. As the handset must meet strict government regulations regarding distortion, the power amplifier must handle the changing load impedance without exceeding the allowed distortion.

One prior art technique is to supply the power amplifier (PA) with significantly more primary power. This allows for more linear operation into mismatch, but results in an inefficient, large power amplifier. This reduces the talk time unless the battery is grown, and increases the cost of the PA. Another prior art technique uses two smaller PAs. The load to each PA is inverse to one another. Thus, when one sees an open, the other sees a short. This minimizes distortion but requires more semiconductor area. The efficiency suffers due to the loss in the combined network. Alternatively, an isolator may be placed between the power amplifier and the antenna. The isolator adds cost, is large, adds loss and so requires a larger PA, and restricts the bandwidth of the transmitter.

SUMMARY

An apparatus and method for adapting a power amplifier to a varied load includes modifying the drive signal to the power amplifier, measuring the value of at least one electrical parameter, determining a difference between the measured value and a predetermined value, and periodically adjusting the drive signal according to the difference. The apparatus can also vary the bias network of the power by adjusting one of the following electrical parameters: average Drain to Source Voltage ($VDS_{avg}$), average Drain to Source current ($IDS_{avg}$), average Gate to Source voltage ($VGS_{avg}$), for each stage as necessary. The nomenclature is as typically used for Field Effect Transistors, but this technique can be applied as well to Bipolar Junction Transistors.

BRIEF DESCRIPTION IF THE DRAWINGS

DETAILED DESCRIPTION

The power amplifier bias controller of the present invention has the capability of changing its characteristic load line, allowing reconfiguring for different loads. As the near field changes, the amplifier can be re-biased, the drive level modified, to follow the impedance change while maintaining constant power to the antenna.

Figure 1:
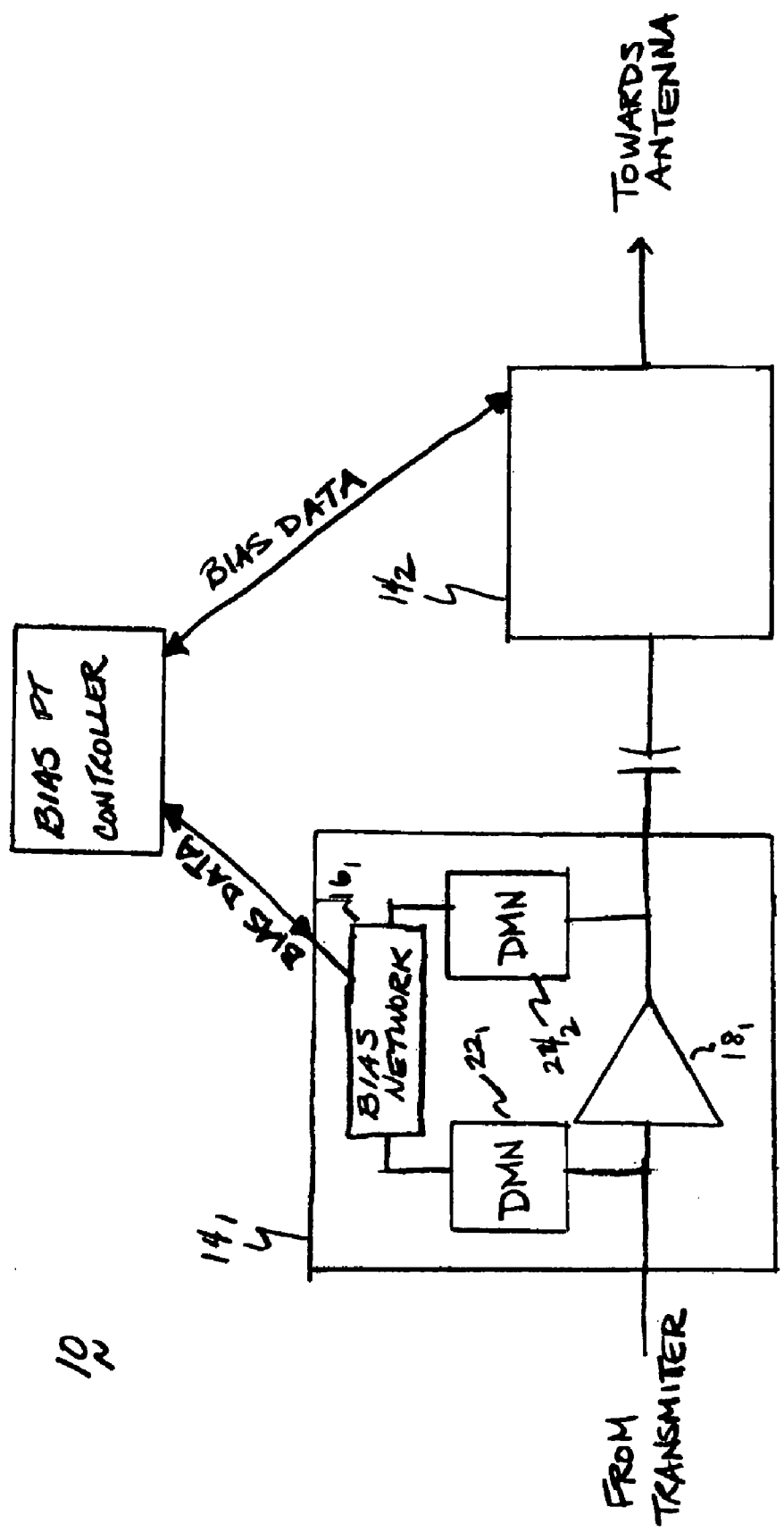
FIG. 1 illustrates a power amplifier bias controlled system 10 of the present invention.

FIG. 1 illustrates a functional schematic for a two stage power amplifier bias controlled system 10 of the present invention. The number of stages is not in principle limited. Only the output stage must be controlled, but every stage could utilize this invention. A capacitor 12 interposes an output of a driver stage $14_1$ and an input of an output stage $14_2$. Each stage $14_n$ has an input matching structure and an output matching structure. For the stage $14_n$, a bias section $16_n$ is connected in parallel to a power amplifier $18_n$. Each bias section $16_n$ includes a bias network $20_n$ interposing a first and a second decoupling and matching network $22_n$, $24_n$. Each bias network $20_n$ bidirectionally connects with a quiescent bias point controller 26.

Figure 2:
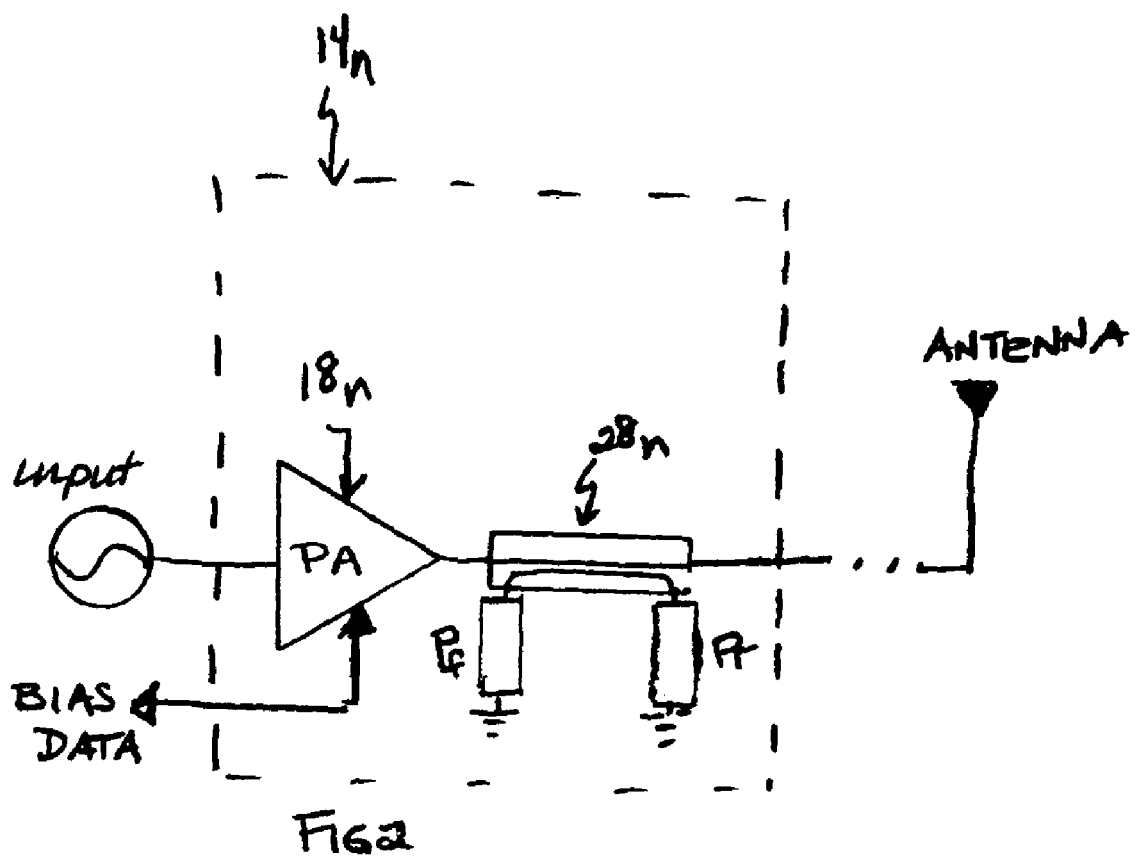
FIG. 2 illustrates further details of a power amplifier stage shown in FIG. 1.

FIG. 2 corresponds to a circuit schematic diagram for the stage $14_n$ shown in FIG. 1. A directional coupler $28_n$ connects to the output of a power amplifier $18_n$. The power delivered by the PA is detected. If this power is other than expected, an algorithm is engaged to determine which of the described techniques is required to return the power to the expected level.

The difference between the measured forward power and the expected forward power is determined, either within the handset or by the base station (not shown). The power is adjusted by changing parameters such as $IDS_{avg}$, $IDS_{avg}$, $VGS_{avg}$, and input power.

In some systems, the base station commands the handset to increment or decrement the output power. At each command, the output power is compared to the expected power, and an algorithm is engaged to determine whether the PA must be reconfigured to match the load.

Although the present invention has been disclosed using the nomenclature of field effect transistors, the concept is easily extended to amplifiers made using bipolar junction transistors.

The invention claimed is:

1. An amplifier system, comprising:
    a power amplifier;
    a directional coupler coupled to an output of the power amplifier;
    a bias network coupled to the power amplifier; and
    a bias point controller coupled to the bias network through a bi-directional communication link, the bias point controller configured to receive power level data corresponding to amplifier output power detected in the directional coupler, and further configured, upon encountering an unexpected power level, to engage an algorithm that determines one of a plurality of techniques for returning the unexpected power level to an expected power level.

2. The amplifier system of claim 1, wherein the plurality of techniques comprises adjusting at least one of a) an average drain-source current of a FET that is a part of the power amplifier, b) an average drain-source voltage of the FET, c) an average gate-source voltage of the FET, or d) input power applied to the power amplifier.

3. The amplifier system of claim 1, wherein the bias network is coupled to an input of the power amplifier through a first decoupling and matching network.

4. The amplifier system of claim 3, wherein the bias network is further coupled to the output of the power amplifier through a second decoupling and matching network.

5. A method of controlling an amplifier, the method comprising:
    detecting a power level at an output of the amplifier;
    determining if the detected power level is at an unexpected power level as a result of a change in output impedance load on the amplifier; and
    compensating for the change in output impedance load by varying a characteristic load line of the amplifier, the varying comprising:

engaging an algorithm that determines which one specific technique amongst a plurality of techniques should be used to change a bias point of the amplifier for varying the characteristic load line and returning the unexpected power level to an expected power level.

6. The method of claim 5, wherein the plurality of techniques comprises at least one of a) adjusting an average drain-source current of a FET that is a part of the amplifier, b) adjusting an average drain-source voltage of the FET, c) adjusting an average gate-source voltage of the FET, or d) adjusting input power applied to the amplifier.

7. The method of claim 5, wherein detecting the power level at the output of the amplifier comprises detecting at least one of a forward power level $P_f$ or a reflected power level $P_r$ at the output of the amplifier.

* * * * *